US006870973B2

(12) United States Patent
Fidric et al.

(10) Patent No.: US 6,870,973 B2
(45) Date of Patent: Mar. 22, 2005

(54) FIBER DEPOLARIZER FOR FABRY-PEROT LASER DIODES

(75) Inventors: Bernard G. Fidric, Cupertino, CA (US); Shaoping Lu, Palo Alto, CA (US); Steven Sanders, Belmont, CA (US); Bruno Acklin, Mountain View, CA (US)

(73) Assignee: JDS Uniphase Corporation, San Jose, CA (US)

( * ) Notice: Subject to any disclaimer, the term of this patent is extended or adjusted under 35 U.S.C. 154(b) by 194 days.

(21) Appl. No.: 10/263,109

(22) Filed: Oct. 2, 2002

(65) Prior Publication Data

US 2004/0005106 A1 Jan. 8, 2004

Related U.S. Application Data

(60) Provisional application No. 60/393,728, filed on Jul. 8, 2002.

(51) Int. Cl.$^7$ ............................................. G02B 6/00
(52) U.S. Cl. ................................................ 385/11
(58) Field of Search .......................... 385/11, 88, 12, 385/24; 356/460; 372/6, 22

(56) References Cited

U.S. PATENT DOCUMENTS

| | | | | |
|---|---|---|---|---|
| 5,488,683 A | * | 1/1996 | Michal et al. ................ | 385/11 |
| 5,692,082 A | | 11/1997 | Fukushima ................ | 385/88 |
| 6,522,796 B1 | * | 2/2003 | Ziari et al. .................. | 385/11 |
| 6,603,593 B2 | * | 8/2003 | Fidric et al. ................ | 359/334 |
| 6,618,521 B2 | * | 9/2003 | Koshi .......................... | 385/11 |
| 2002/0025111 A1 | | 2/2002 | Koshi .......................... | 385/24 |

OTHER PUBLICATIONS

"Degree of Polarization in Jointed Fibers: the Lyot Depolarizer" Mochizuki Applied Optics, vol. 23, No. 19, Oct. 1, 1984 pp. 3284–3288.

"Degree of Polarization in the Lyot Depolarizer" Burns Journal of Lightwave Technology, vol. LT–1, No. 3, Sep. 1983 pp. 475–479.

"Performance of Lyot Depolarizers with Birefringent Single-Mode Fibers" Bohm et al. Journal of Lightwave Technology, vol. LT–1, No. 1, Mar. 1983 pp. 71–74.

"Reduction of the Degree of Polarization of a Laser Diode with a Fiber Lyot Depolarizer" Wang et al. IEEE Photonics Technology Letters, vol. 11, No. 11, Nov. 1999 pp. 1449–1451.

"Design of Temperature Insensitive Depolarizer for Raman Pump Laser Diode" Matsushita et al. OFC 2002, Wednesday Morning 9:30 a.m. pp. 181–183.

* cited by examiner

*Primary Examiner*—Brian Healy
*Assistant Examiner*—James P. Hughes
(74) *Attorney, Agent, or Firm*—Allen, Dyer, Doppelt, Milbrath & Gilchrist, P.A.

(57) ABSTRACT

A Lyot depolarizer for depolarizing a laser with multiple longitudinal modes comprises two segments of PM fiber optimized for length as a function of the longitudinal mode spacing of the laser source, and not as taught in the prior art as a function of the laser coherence length. The present invention has found secondary coherence peaks in the coherence function of a multiple longitudinal mode source, which can significantly worsen the DoP if the PM fiber lengths are significantly extended beyond optimum, contrary to the teaching in the prior art. The present invention makes use of the periodic structure of the source spectrum by converting half the longitudinal modes to an orthogonal polarization state. As a result a significantly shorter fiber depolarizer is needed than for a single longitudinal mode source. Greater temperature stability is achieved by properly adjusting the lengths of both segments of PM fiber.

6 Claims, 6 Drawing Sheets

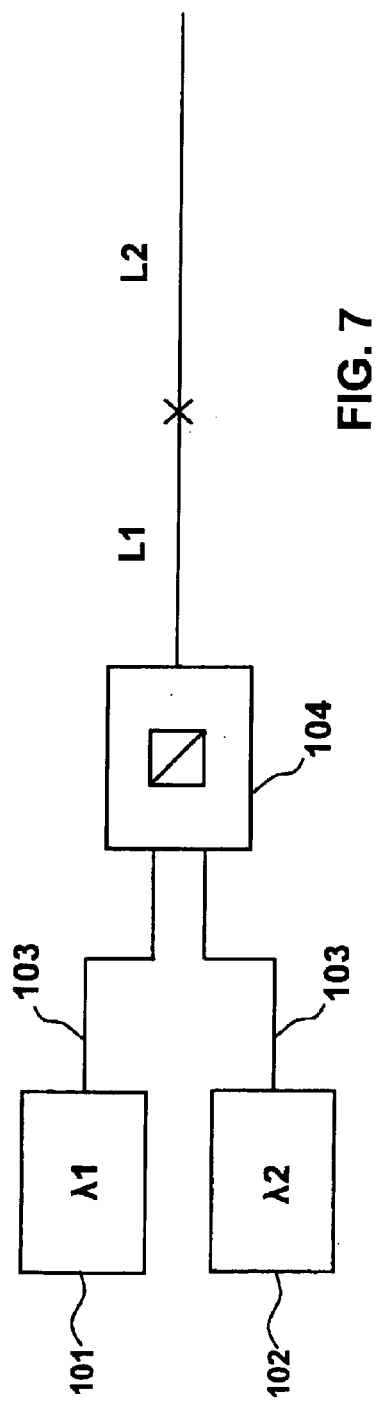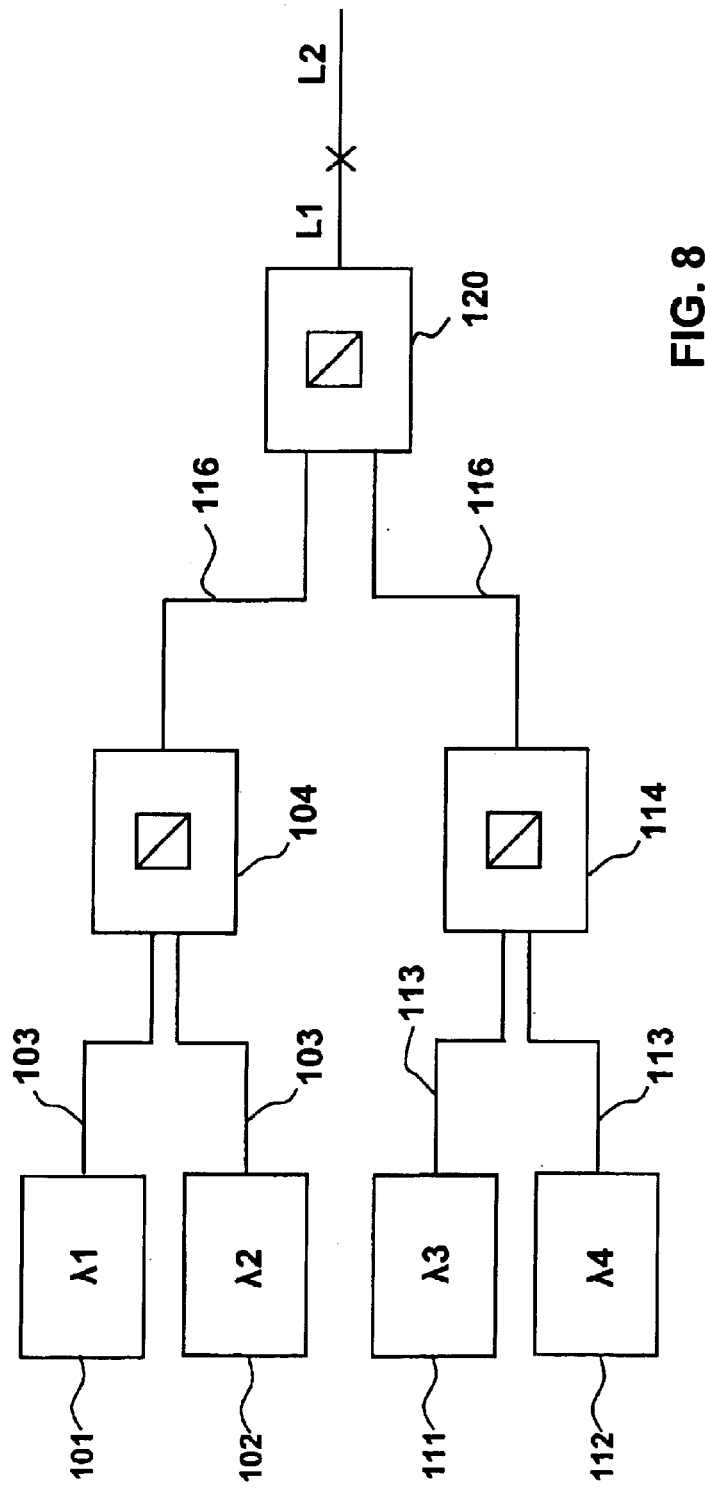

FIBER DEPOLARIZER FOR FABRY-PEROT LASER DIODES

CROSS-REFERENCE TO RELATED APPLICATIONS

This application claims priority from provisional application No. 60/393,728 filed Jul. 8, 2002, for the present invention.

MICROFICHE APPENDIX

Not Applicable.

TECHNICAL FIELD

The present application relates to optical fiber depolarizers and depolarized optical sources incorporating the same.

BACKGROUND OF THE INVENTION

In many optical systems, such as pumps in optical communication systems, fiber gyros, control channels in optical amplifiers, sensors, and inteferometers, it is desirable to have a depolarized source to reduce polarization effects. In particular, Raman amplifiers are becoming increasingly used for distributed or remote amplification. These amplifiers are useful because they may be implemented in the normal fiber that carries the optical communications signal, and as a result, systems may be designed where amplification occurs in the transmission link itself, allowing greater transmission distances between amplifiers, higher receiver sensitivities, and lower transmission powers have the added advantage of reducing nonlinear effects in the fiber. Furthermore, the wavelength at which the fiber Raman amplifier operates is determined by the wavelength of the pump light, unlike a rare earth-doped fiber amplifier whose gain bandwidth is limited by the rare earth species doped in the fiber. Raman is also a very low noise process, limited primarily at low powers by pump noise and quantum noise effects.

One particular concern with Raman amplification is the polarization dependence of the amplification process. The Raman gain coefficient when the pump light is polarized parallel to the signal polarization is about an order of magnitude greater than when the pump polarization is orthogonal to the signal polarization.

A long-haul single mode optical fiber is usually non-polarization preserving due its lower cost and superior performance compared to polarization maintaining fiber. Therefore, the polarizations of the pump and signal to change relative to each other as they propagate along the length of the fiber amplifier. In practice, Raman amplifiers are long, up to several kilometers in length, which permits sufficient variation in the relative polarizations of the signal and the pump that the polarization-dependent gain (PDG) effect is averaged out.

However, there remains a possibility that the pump and signal maintain the same relative polarizations for a significant length of the fiber amplifier. In such situations, the amplifier gain may be strongly dependent on the relative polarizations of the signal and the pump. This leads to uncertainty in amplifier performance, which results in increased errors in signal detection or increased system margin requirements.

One approach to reducing the effect of PDG is to use pump source light that is "unpolarized," or that has a low degree of polarization. Unpolarized light is light that does not have a dominant polarization at an instantaneous point in time, or for which the dominant polarization changes more quickly than an amplifier response time.

Unpolarized light is further characterized as light which, when passed through a linear or circular polarization analyzer and incident on an optical power meter, shows no appreciable variation in transmitted power with analyzer azimuthal direction, and has no phase relationship between the two orthogonal polarization states.

As understood in this application, light is considered depolarized if the intensity of the light output from the depolarizer is substantially equally divided between orthogonal polarization states with no phase correlation between these two components. The use of unpolarized light to pump an optical gain medium alleviates the PDG effects, making it desirable for many optical pumping applications.

In the past, different techniques have been used to depolarize the light from a polarized light source. One conventional method for converting polarized light to depolarized light is to launch the polarized beam into a single piece of polarization maintaining (PM) optical fiber so that the launch angle is substantially at an angle of 45° relative to the birefringence axes of the PM fiber. Such a device is called a single-stage fiber Lyot depolarizer. Certain variations on this method are shown in U.S. Pat. No. 5,692,082 by N. Fukushima of Fujitsu Limited. The length of the PM fiber, as taught by Fukushima, is set so that an optical path length difference for the two polarization modes propagating through the PM fiber is greater than the coherence length of the incident light. As such, the two polarization modes are phase decorrelated, and the polarization state of the light output from the fiber is effectively randomized. However, the depolarizer in accordance with the teaching of Fukushima is costly because it requires a very long piece of PM fiber (e.g., ~100 meters for a longitudinal mode linewidth of the order of 10 GHz). In addition it has proved highly temperature sensitive. Indeed it was observed that the degree of polarization (DoP) fluctuates rapidly and with a large amplitude (~15–20%) over a temperature range as small as a few degrees. Thus this approach is only suitable for pump applications that can tolerate a DoP of approximately 20%.

In an article entitled "Degree of Polarization in the Lyot Depolarizer", published in the Journal of Lightwave Technology, Vol. LT-1, No. 3, September 1983, William K. Burn teaches the calculation of optimum birefringent fiber lengths for a two-stage Lyot depolarizer for depolarizing the output of a laser source having a single longitudinal mode. In the case of a single longitudinal mode, the coherence function of the spectrum decreases monotonically with increased fiber length. Thus, as long as a minimum depolarizing fiber length is provided, a precise length is not necessary.

More recently, Hiroyuki Koshi of The Furukawa Electric Co. Ltd discloses in U.S. published application Ser. No. 0,025,111 A1 published Feb. 28, 2002, the use of a fiber depolarizers with Fabry-Perot lasers in a multiple pump architecture. Each depolarizer is a two-stage fiber Lyot depolarizer the lengths $L_1:L_2$ having a ratio of 1:2. The lengths of the PM fiber are adjusted in accordance with the coherence length of the incident light. Koshi states that "the effect of canceling the degree of polarization of the pumping source does not change even if the lengths of the polarization-maintaining optical fibers are set longer than the optimal lengths." The Fabry-Perot lasers used in the Koshi device produce a multiple longitudinal mode spectral output, not a single longitudinal mode as assumed by Burn. As shown by the present invention, the DoP can actually be made worse by extending the length of the PM fibers beyond the optimum length. Koshi did not realize this. Accordingly, the temperature instability exhibited in the prior art is not adequately corrected in the Koshi disclosure.

A low cost, low loss temperature insensitive depolarizer is highly desired for Raman pumping architectures based on high power laser diodes, particularly a depolarizer capable of providing a DoP of less than 10%.

SUMMARY OF THE INVENTION

The present invention has found that a Lyot depolarizer for depolarizing a laser with multiple longitudinal modes comprises two segments of PM fiber optimized for length as a function of the longitudinal mode spacing of the laser source, and not as taught in the prior art as a function of the laser coherence length. Furthermore, the present invention has found secondary coherence peaks in the coherence function of a multiple longitudinal mode source, which can significantly worsen the DoP if the PM fiber lengths are significantly extended beyond optimum, contrary to the teaching in the prior art.

The present invention makes use of the periodic structure of the source spectrum, assuming substantially equal power in alternate longitudinal modes, by converting half the longitudinal modes to an orthogonal polarization state. As a result a significantly shorter fiber depolarizer is needed than for a single longitudinal mode source. And furthermore, greater temperature stability is achieved by properly adjusting the lengths of both segments of PM fiber.

Thus an aspect of the present invention provides a depolarizer for converting a linearly polarized laser output having multiple longitudinal modes into light in which the intensity is substantially equally divided between orthogonal polarization states comprising:

a first segment $L_1$ of polarization maintaining optical fiber optically coupled to receive the linearly polarized laser output, said first segment having orthogonal birefringent axes, one of said orthogonal birefringent axes being oriented at substantially zero degrees relative to a plane of polarization of the laser output, said first segment having a length such that:

$$2\lambda^2/(9.\Delta\lambda.\Delta n_1) < L_1 < \lambda^2/(3.\Delta\lambda.\Delta n_1);$$

a second segment $L_2$ of polarization maintaining optical fiber optically coupled to the first segment of PM fiber, said second segment having orthogonal birefringent axes oriented at substantially 45 degrees to the orthogonal birefringent axes of the first segment, said second segment having a length such that:

$$4\lambda^2/(9.\Delta\lambda.\Delta n_2) < L_2 < 2\lambda^2/(3.\Delta\lambda.\Delta n_2)$$

where $\lambda$ is the laser diode wavelength, $\Delta\lambda$ is the laser longitudinal mode spacing, and $\Delta n_1$ is the birefringence of the polarization maintaining fiber of the first segment of polarization maintaining fiber, and $\Delta n_2$ is the birefringence of the polarization maintaining fiber of the second segment of polarization maintaining optical fiber.

A further aspect of the invention provides a depolarized optical source comprising:

a laser source emitting a linearly polarized beam comprising multiple longitudinal modes;

a first segment $L_1$ of polarization maintaining optical fiber optically coupled to receive the beam from the laser source, said first segment having orthogonal birefringent axes, one of said orthogonal birefringent axes being oriented at substantially zero degrees relative to a plane of polarization of the emitted beam, said first segment having a length such that:

$$2\lambda^2/(9.\Delta\lambda.\Delta n_1) < L_1 < \lambda^2/(3.\Delta\lambda.\Delta n_1);$$

a second segment $L_2$ of polarization maintaining optical fiber optically coupled to the first segment of PM fiber, said second segment having orthogonal birefringent axes oriented at substantially 45 degrees to the orthogonal birefringent axes of the first segment, said second segment having a length such that:

$$4\lambda^2/(9.\Delta\lambda.\Delta n_2) < L_2 < 2\lambda^2/(3.\Delta\lambda.\Delta n_2)$$

where $\lambda$ is the laser diode wavelength, $\Delta\lambda$ is the laser longitudinal mode spacing, and $\Delta n_1$ is the birefringence of the polarization maintaining fiber of the first segment of polarization maintaining fiber, and $\Delta n_2$ is the birefringence of the polarization maintaining fiber of the second segment of polarization maintaining optical fiber.

In a further preferred embodiment a depolarizer for depolarizing a laser source having multiple longitudinal modes comprises:

a first segment of polarization maintaining fiber for receiving an output from the laser source, having an optical axis aligned with a plane of polarization of the output of the laser source, the first segment having a length $L_1 \sim \lambda^2/(4.\Delta\lambda.\Delta n_1)$; and a second segment of polarization maintaining fiber optically coupled to the first segment, having an optical axis oriented at an angle of approximately 45 degrees to the optical axis of the first segment, the second segment having a length $L_2 \sim \lambda^2/(2.\Delta\lambda.\Delta n_2)$ to make adjacent laser modes orthogonally polarized.

BRIEF DESCRIPTION OF THE DRAWINGS

Further features and advantages of the present invention will become apparent from the following detailed description, taken in combination with the appended drawings, in which:

FIG. 7 is a schematic illustration of a Raman pumping architecture using two pump sources optically coupled to a depolarizer of the present invention; and FIG. 8 is a schematic illustration of a Raman pumping architecture using four pump sources optically coupled to a depolarizer of the present invention.

It will be noted that throughout the appended drawings, like features are identified by like reference numerals.

DETAILED DESCRIPTION OF THE PREFERRED EMBODIMENT

There is no consensus in the prior art regarding the optimization of optical fiber Lyot depolarizers. Recently at OFC '02, S. Matsushita et al. from Fitel published a paper entitled "Design of Temperature Insensitive Depolarizer for Raman Pump Laser Diode", paper WB3, OFC '02, Mar. 17–22, 2002. This is a mostly empirical paper which does not provide a methodology nor any formula for an optimum depolarizer length. For reducing temperature sensitivity, however, Matsushita suggests a pigtail length that is ⅓ of the depolarizer length. By contrast, J. S. Wang et al. teach that the longer section, i.e. the depolarizer length, should be about ⅔ the length calculated from the laser mode spacing and the fiber birefringence, that is $L_2 \sim 2\lambda^2/(3 \cdot \Delta\lambda \cdot \Delta n_2)$, and the shorter section, i.e. the pump pigtail, should be between ½ and ⅓ the longer section, that is $\lambda_2/(3 \cdot \Delta\lambda \cdot \Delta n_1) < L_1 < 4\lambda^2/(9 \cdot \Delta n_1)$, in an article entitled "Reduction of the Degree of Polarization of a Laser Diode with a Fiber Lyot Depolarizer" published in IEEE Photonices Technology Letters, Vol. 11, No. 11, November 1999, p. 1449–51. The authors achieved a DoP of approximately 20%.

Figure 1:
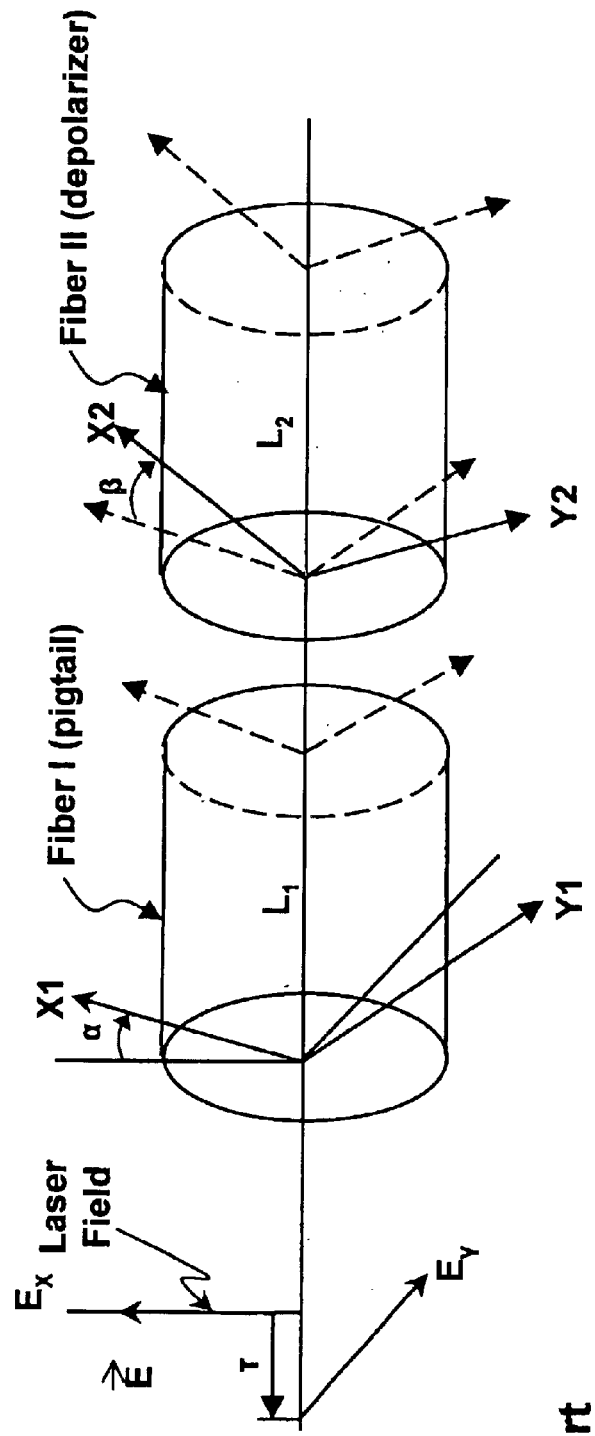
FIG. 1 illustrates a schematic configuration of optically coupled birefringent optical fibers forming a Lyot depolarizer.

In order to be practical, especially for a co-propagating Raman pump application, it is desired to achieve a DoP of less than 10%. FIG. 1 shows a schematic configuration of polarization maintaining fiber pigtail $L_1$ optically coupled to polarization maintaining fiber depolarizer $L_2$. A slow axis X1 of $L_1$ is disposed at an angle $\alpha$ to the plane of polarization of the laser field, and the fast axis Y1 is orthogonal to X1. Fiber $L_2$ is coupled to $L_1$ with a slow axis X2 disposed at an angle $\beta$ to the slow axis X1 of fiber $L_1$, and a fast axis Y2 orthogonal to X2.

With reference to an article by Kiyofumi Mochizuki, entitled "Degree of polarization in jointed fibers: the Lyot depolarizer," published in Applied Optics, Vol. 23, No. 19, 1 Oct. 1984, p. 3284–3288, the DoP at the output of $L_2$ can be calculated as follows:

$$DoP = \Big[\cos^2(2\alpha) \cdot \{\cos^2(2\beta) + \sin^2(2\beta) \cdot [\Gamma(\tau_2)]^2\} + \sin^2(2\alpha) \cdot \Big\{\frac{1}{2}\sin^2(2\beta) \cdot [\Gamma(\tau_1)]^2 + \cos^4\beta \cdot [\Gamma(\tau_1+\tau_2)]^2 + \sin^4\beta \cdot [\Gamma(\tau_2-\tau_1)]^2\Big\} - \sin(4\alpha) \cdot \sin(2\beta) \cdot \Gamma(\tau_2) \cdot [\cos^2\beta \cdot \Gamma(\tau_1+\tau_2) - \sin^2\beta \cdot \Gamma(\tau_2-\tau_1)] \cdot \cos(L_1\Delta\beta_1) + \frac{1}{2}\sin^2(2\alpha) \cdot \sin^2(2\beta) \cdot \{[\Gamma(\tau_1)]^2 - \Gamma(\tau_2-\tau_1) \cdot \Gamma(\tau_1+\tau_2)\} \cdot \cos(2L_1\Delta\beta_1)\Big]^{1/2}$$

Equation 1

$\Gamma(\tau)$ is the coherence function of the light source, that is, the Fourier transform of its frequency spectrum, where $\tau_1$ and $\tau_2$ represent the polarization mode dispersion in fibers $L_1$ and $L_2$ respectively.

It is assumed that $\alpha$ is nominally zero degrees (or equivalently 90 degrees), that is, the slow axis X1 (or equivalently the fast axis Y1) of the laser pigtail $L_1$ is aligned with the linear polarized beam exiting the laser diode. In practice there could be an offset as high as, for example, 5 degrees due to alignment error with the laser output. As shown further below this misalignment contributes significantly to the DoP peak. It should be minimized as much as possible.

$$\alpha = \epsilon_p \ll 1 \qquad \text{Equation 2}$$

It is also assumed that $\beta$ is approximately 45 degrees, that is, the birefringent axes X2 and Y2 of the depolarizer fiber $L_2$ are oriented at approximately 45 degrees relative to the axes X1, Y1 of the pigtail fiber $L_1$.

$$\beta = \pi/4 + \epsilon_d, \text{ with } \epsilon_d \ll 1 \qquad \text{Equation 3}$$

Then a good approximation for the DoP is:

$$DoP \cong \Big[4\epsilon_d^2 + \Gamma_2^2 + 2\epsilon_p \cdot \Gamma_2 \cdot (\Gamma_{2-1} - \Gamma_{2+1}) \cdot \cos(L_1\Delta\beta_1) + 2\epsilon_p^2 \cdot \{\Gamma_1^2 + (\Gamma_1^2 - \Gamma_{2+1} \cdot \Gamma_{2-1}) \cdot \cos(2L_1\Delta\beta_1) + \frac{1}{2}(\Gamma_{2+1}^2 + \Gamma_{2-1}^2)\}\Big]^{\frac{1}{2}}$$

Equation 5 using the following notations:

$\Gamma_1 = \Gamma(\tau_1); \Gamma_2 = \Gamma(\tau_2); \Gamma_{2+1} = \Gamma(\tau_1+\tau_2)$ and $\Gamma_{2-1} = \Gamma(\tau_2-\tau_1)$ In practice, the length $L_1$ of the first birefringent fiber corresponds to many beat lengths, $L_1 \gg (\lambda/\Delta n_1)$. Hence both $\cos(L_1\Delta\beta_1)$ and $\cos(2L_1\Delta\beta_1)$ vary rapidly with temperature due to minute changes in the mean wavelength $\lambda$, or the filter length $L_1$ or the birefringence $\Delta n_1$. Therefore, an optimum design of the depolarizer should aim at minimizing the peak DoP value which is (from equation 4).

$$DoP_{peak} \cong [4\epsilon_d^2 + \Gamma_2^2 + 2\epsilon_p \cdot \Gamma_2 \cdot |(\Gamma_{2-1} - \Gamma_{2+1})| + \epsilon_p^2 \cdot \{2\Gamma_1^2 + 2|\Gamma_1^2 - \Gamma_{2+1} \cdot \Gamma_{2-1}| + \Gamma_{2+1}^2 + \Gamma_{2-1}^2\}]^{1/2}$$

Equation 5 if $\Gamma_1^2 \geq \Gamma_{2+1} \cdot \Gamma_{2-1}$, then.

$$DoP_{peak} \cong [4\epsilon_d^2 + \Gamma_2^2 + 2\epsilon_p \cdot \Gamma_2 \cdot |(\Gamma_{2-1} - \Gamma_{2+1})| + \epsilon_p^2 \cdot \{4\Gamma_1^2 + (\Gamma_{2-2} - \Gamma_{2+1})^2\}]^{1/2}$$

Equation 6 if $\Gamma_1^2 < \Gamma_{2+1} \cdot \Gamma_{2-1}$, then $$DoP_{peak} \cong [4\epsilon_d^2 + \Gamma_2^2 + 2\epsilon_p \cdot \Gamma_2 \cdot |(\Gamma_{2-1} - \Gamma_{2+1})| + \epsilon_p^2 \cdot (\Gamma_{2-1} + \Gamma_{2+1})^2]\text{Equation 7}$$

Expressions $\epsilon_d$ and $\epsilon_p$ from the angular orientation of the PM fibers should be minimized as much as possible. In practice $\epsilon_d$ can be kept below 0.02 (<1 degree), with a good PM fusion splicer. But $\epsilon_p$ may be as high as 0.09 (5 degrees) depending on the laser packaging technology. Hence the first design objective is to minimize $\Gamma_2$.

Figure 2:
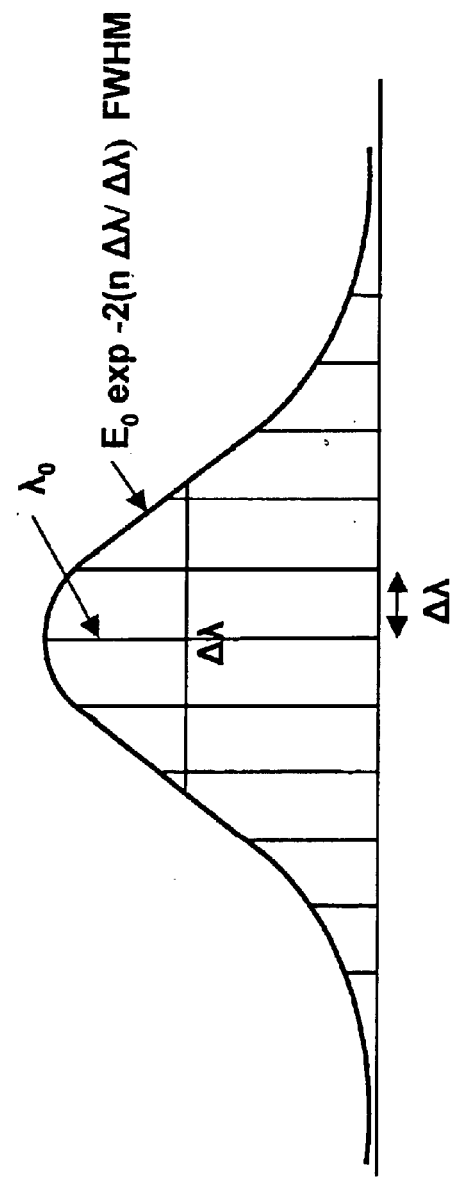
FIG. 2 illustrates schematically a spectrum of a laser diode operating in multiple longitudinal modes.

FIG. 2 illustrates schematically a spectrum of a laser diode operating in multiple longitudinal modes. In the case of a Fabry-Perot laser with multiple longitudinal modes, it can be shown that:

$$\Gamma_2 \cong 0, \text{ for } L_2 = \lambda^2/(2\Delta\lambda \cdot \Delta n_2) \qquad \text{Equation 8}$$

where $\Delta\lambda$ is the laser longitudinal mode spacing and $\Delta n_2$ is the birefringence of the fiber used in $L_2$.

Once equation 8 is satisfied, then the maximum DoP is limited to:

$$DoP_{peak}(\Gamma_2 \cong 0) \cong [4\epsilon_d^2 + \epsilon_p^2 \cdot \{2\Gamma_1^2 + 2|\Gamma_1^2 - \Gamma_{2+1} \cdot \Gamma_{2-1}| + \Gamma_{2+1}^2 + \Gamma_{2-1}^2\}]^{1/2}$$

Equation 9

Then the optimum length for the first birefringent fiber pigtail $L_1$ is such that:

$$\{2\Gamma_1^2 + 2|\Gamma_1^2 - \Gamma_{2+1} \cdot \Gamma_{2-1}| + \Gamma_{2+1}^2 + \Gamma_{2-1}^2\} \text{ is minimum} \qquad \text{Equation 10}$$

Figure 3:
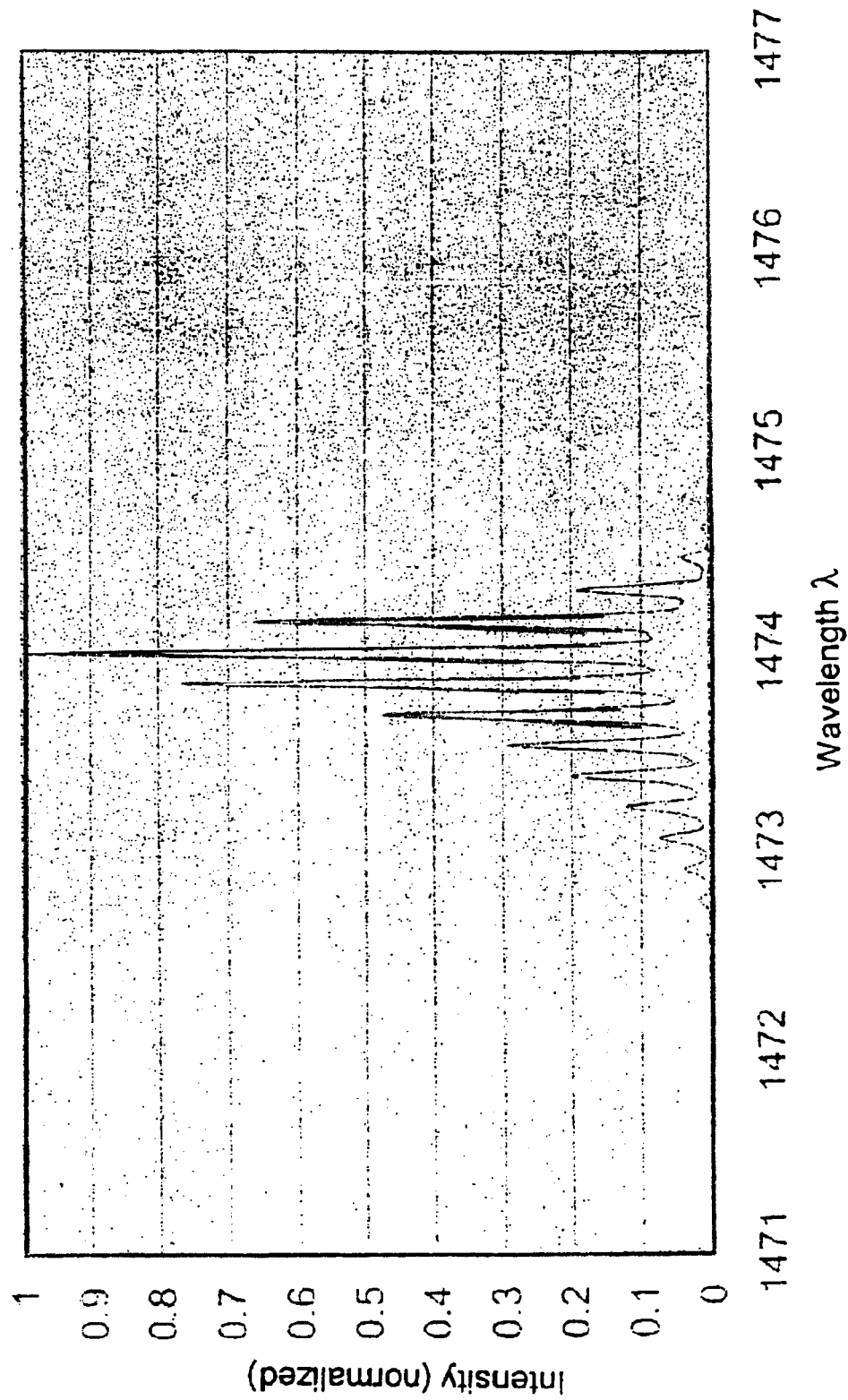
FIG. 3 is a graph of an output spectrum of an exemplary Fabry Perot laser diode.
Figure 4:
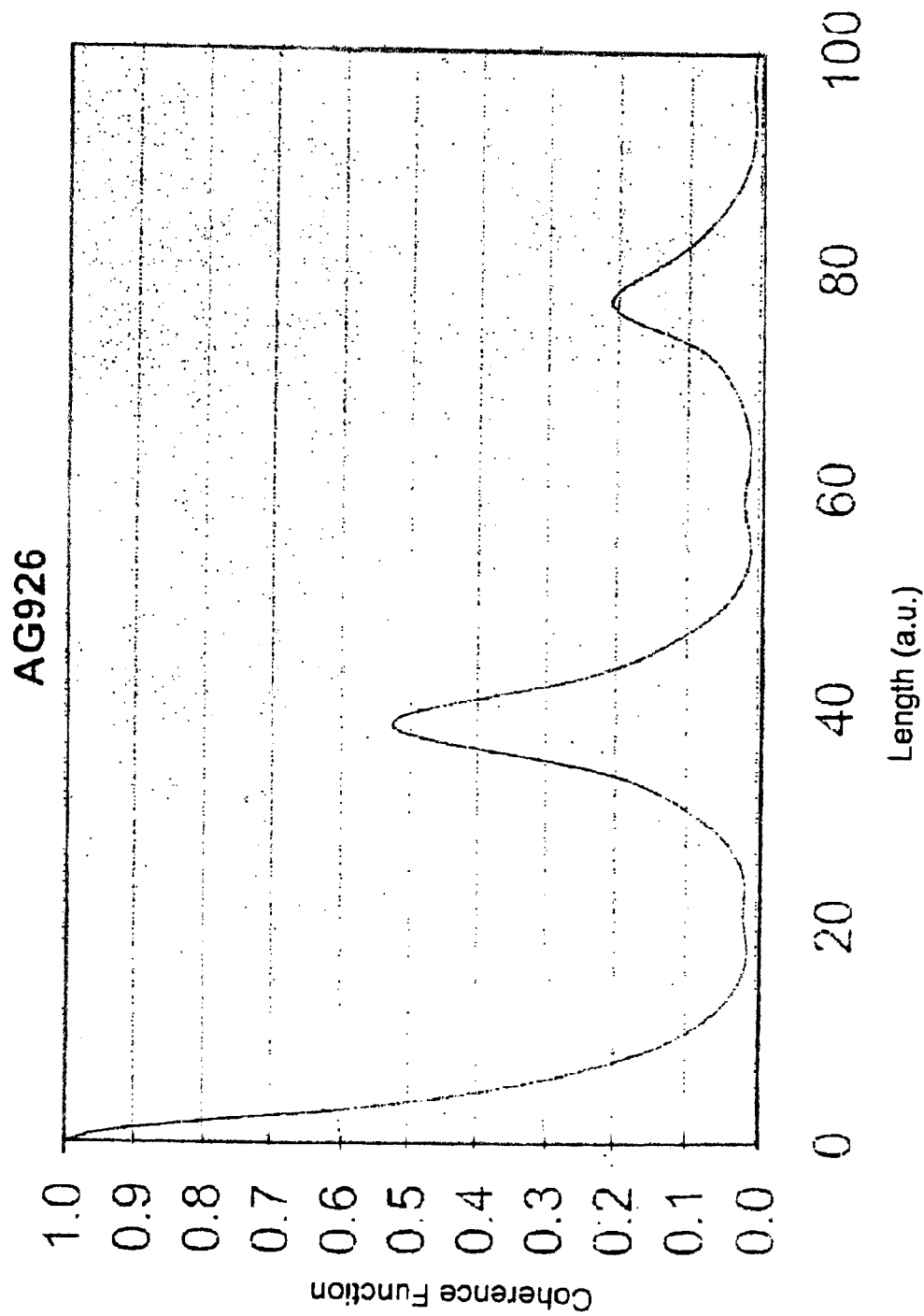
FIG. 4 is a graph of a Coherence function derived as a Fourier transform of FIG. 3.

FIG. 3 graphically illustrates a normalized intensity of a laser spectrum for a 14xx laser diode. The coherence function is a direct Fourier transform of the laser spectrum. FIG. 4 graphically illustrates the coherence function as a function of fiber length for a given birefringence. The secondary peaks are clearly apparent. Accordingly, the optimum pigtail length $L_1$ can be found readily using an Excel™ spreadsheet as exemplified in FIG. 5.

Figure 5:
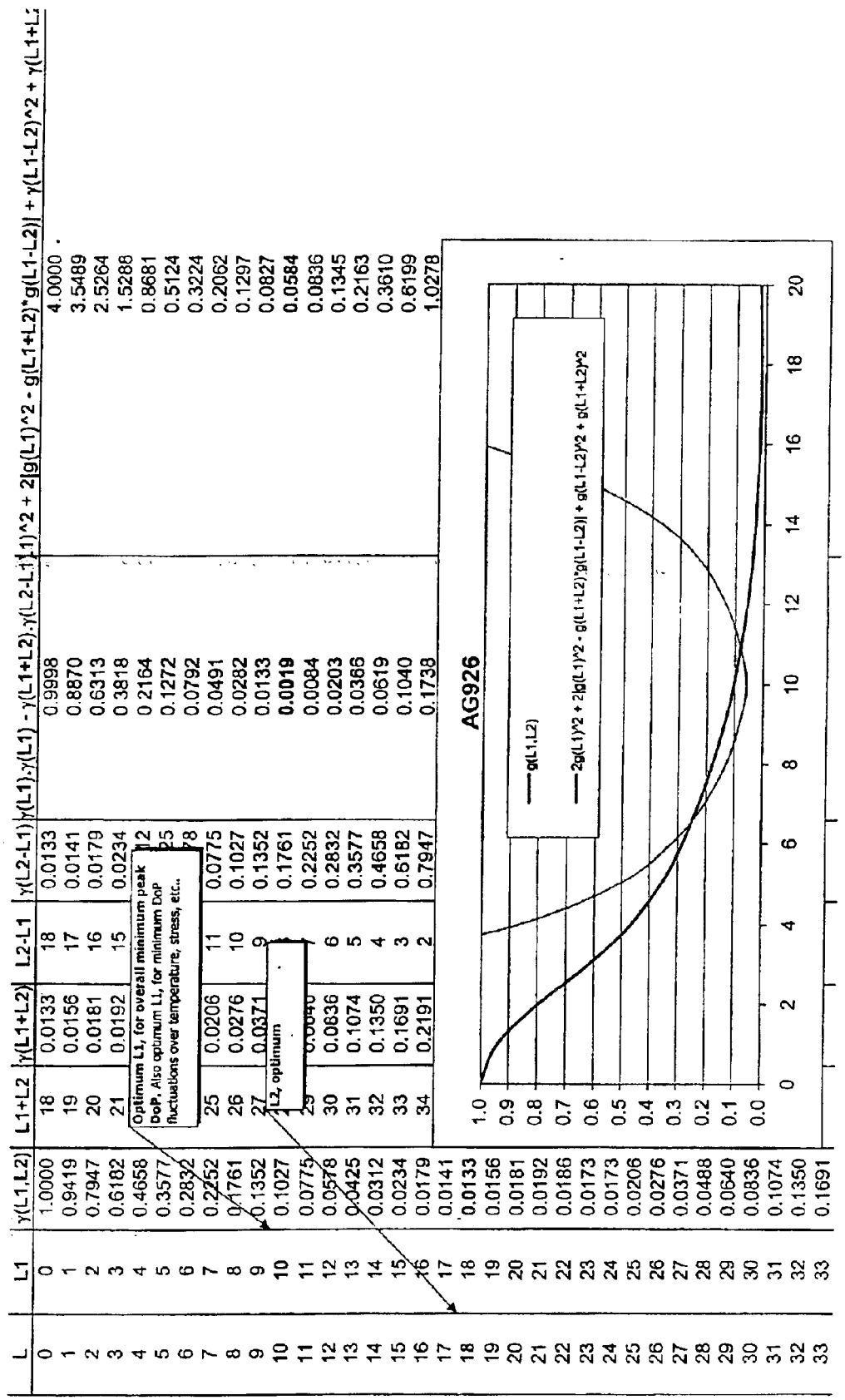
FIG. 5 is an Excel™ spreadsheet demonstrating fiber length optimization.

As seen in FIG. 5, the bold curve represents the coherence function, $\Gamma \equiv \Gamma(\tau) \equiv \Gamma(L)$, that is, the Fourier transform of the laser spectrum. It is the same as the curve shown in FIG. 4, but limited to the 0 to 20 (meters) length range. This curve is used for optimizing the length $L_2$ of the second PM-fiber section by rendering $\Gamma_2 \sim 0$. Per the invention, this is achieved in the range, $4\lambda^2/(9.\Delta\lambda.\Delta n_2) < L_2 < 2\lambda^2/(3.\Delta\lambda.\Delta n_2)$, and in general the optimum corresponds to: $L_2 \sim \lambda_r^2/(2\Delta\lambda \cdot \Delta n_2)$, as indicated in Equation 8.

The fine curve is used for optimizing the length $L_1$ of the first PM-fiber section by minimizing the quantity $\{2\Gamma_1^2 + 2|\Gamma_1^2 - \Gamma_{2+1}| \cdot \Gamma_{2-} + \Gamma_{2+1}^2 + \Gamma_{2-1}^2\}$. Per the invention, this is achieved in the range, $2\lambda^2/(9.\Delta\lambda.\Delta n_1) < L_1 < \lambda^2/(3.\Delta\lambda.\Delta n_1)$, and in general the optimum corresponds to: $(0.4 L_2 < L_1 < 0.6 L_2)$, as indicated in Equation 12.

It is found that condition 10 is generally satisfied when:

$$\Gamma_1^2 - \Gamma_{2+1} \cdot \Gamma_{2-1} \cong 0 \qquad \text{Equation 11}$$

This latter condition also provides minimum DoP fluctuations once condition 8 is also satisfied ($\Gamma_2 \cong 0$) see Equation 4.

It is also found that condition 10 is generally satisfied for $$0.4\, L_2 < L_1 < 0.6\, L_2 \qquad \text{Equation 12}$$

Figure 6:
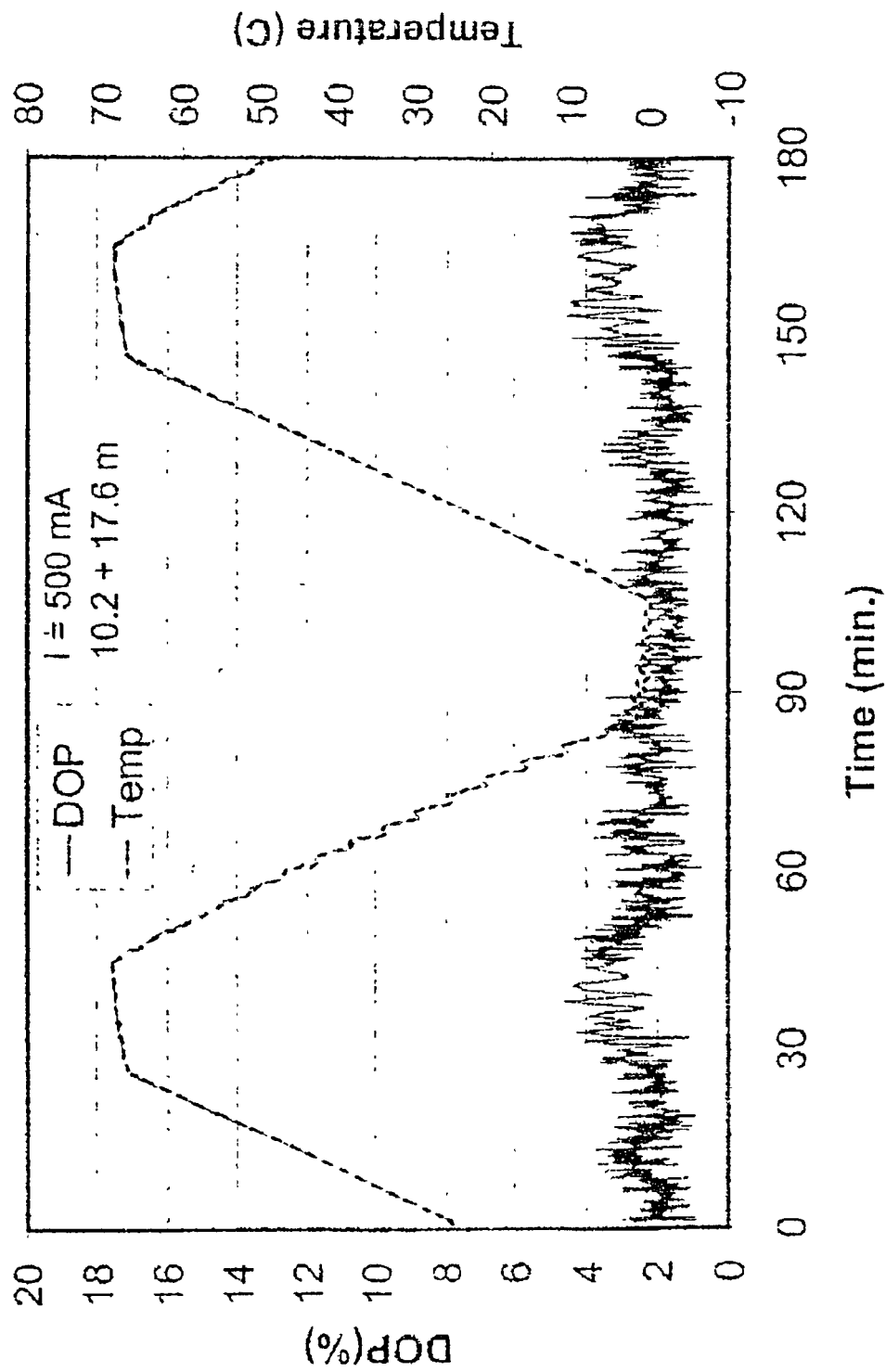
FIG. 6 is a graph illustrating the relative temperature insenitivity of the depolarizer optimized in accordance with the present invention.

Using the method outlined above, a DoP better than 5% over a 0–70 degree C. temperature range was demonstrated, as shown in FIG. 6.

The present invention has demonstrated that temperature sensitivity can be reduced to maintain less than 5% DoP in a PM optical fiber based Lyot depolarizer for use with 14xx nm pump laser diodes. This is quite important for Raman amplifier architectures since the depolarizer of the present invention can reduce insertion loss over previously used depolarizers, and reduce overall costs of an amplifier, by utilizing lower cost components.

Most Raman amplification modules contain several pump lasers to provide multiple pumping wavelengths, typically between 2 and 5. It is preferable to combine all of the pump signals before transmission through a single depolarizer in order to reduce the component cost. FIG. 7 illustrates an amplifier architecture comprising a first pump laser 101 at wavelength $\lambda_1$ and a second pump laser 102 at wavelength $\lambda_2$. Pumps 101 and 102 are coupled via PM optical fiber pigtails 103 to a beam combiner 104, such as a polarization maintaining polarization beam combiner (PBC). The lengths of PM fiber pigtails 103 should be substantially matched. The combined output of the beam combiner 104 is coupled into a first segment $L_1$ of polarization maintaining optical fiber. The slow axis of the fiber $L_1$ is oriented to the plane of polarization of the polarized output of the combiner 104. The first segment $L_1$ is optically coupled to a second segment $L_2$ of PM fiber, with the slow axis of the segment $L_2$ oriented at 45 degrees to the slow axis of the segment $L_1$.

The amplifier architecture illustrated in FIG. 7 can be enlarged, as illustrated in FIG. 8 to incorporate a larger number of pump sources. As shown in FIG. 8, in addition to pumps 101 and 102, two additional pumps 111 and 112 at wavelengths $\lambda_3$ and $\lambda_4$ are similarly combined via PM fiber 113 to a beam combiner 114. Outputs from the two polarization maintaining beam combiners 104 and 114 are combined via PM fiber 116 to a second stage polarization beam combiner 120. The output of combiner 120 is launched into the depolarizer $L_1$ and $L_2$ as described above. The matched length of PM fibers 103/113 can be added to the matched length of PM fibers 116 as a PM optical link. This length is subtracted from the $L_1$ total length.

In order to effectively depolarize the combined pump lasers, two conditions must be met. The polarization of the pump lasers must be maintained prior to launch into the depolarizer. And the depolarizer must be insensitive to the pump wavelengths. The first condition is met by utilizing all polarization maintaining components before the depolarizer.

It can be shown in the following analysis that the depolarizer is not very sensitive to the pumping wavelengths. It has been shown that the optimal fiber lengths for the depolarizer are as follows:

$$L_1 \sim \lambda^2/(4.\Delta\lambda.\Delta n_1)$$

$$L_2 \sim \lambda^2/(2.\Delta\lambda.\Delta n_2)$$

The mode spacing in the laser diode is given by:

$$\Delta\lambda = \lambda^2/2n_g 1$$

where $n_g$ is the group index in the laser diode, and 1 is the diode cavity length. Using this expression, the optimal fiber lengths are then both proportional to $n_g/\Delta n$. The primary wavelength dependence cancels out. Over the wavelength range (~100 nm maximum) of a multi-pump Raman amplifier, the wavelength dependence of $n_g$ and $\Delta n$. are expected to be very small, on the order of a few percent.

The length of the first depolarizing fiber segment $L_1$ shown in FIGS. 7 and 8 may be modified from the optimal length $L_1$. Assuming that the primary cause of polarization mode cross-coupling is due to the launch into the pump module PM fiber pigtails 103, 113, the length should be shortened to $L_1'$ to account for the fiber lengths present before the final beam combiner eg. 120. Preferably the polarization mode dispersion (PMD) experienced by each pump laser signal prior to the final beam combiner 120 should be equal. This requires equal values for the integrals of the fiber birefringence over the fiber length for each pump wavelength up to the point where the pump signals are combined.

The embodiment(s) of the invention described above is(are) intended to be exemplary only. The scope of the invention is therefore intended to be limited solely by the scope of the appended claims.

What is claimed is:

1. A depolarizer for converting a linearly polarized laser output having multiple longitudinal modes into light in which the intensity is substantially equally divided between orthogonal polarization states comprising:

a first segment $L_1$ of polarization maintaining optical fiber optically coupled to receive the linearly polarized laser output, said first segment having orthogonal birefringent axes, one of said orthogonal birefringent axes being oriented at substantially zero degrees relative to a plane of polarization of the laser output, said first segment having a length $L_1$ equal to about:

$$\lambda^2/(4.\Delta\lambda.\Delta n_1);$$

a second segment $L_2$ of polarization maintaining optical fiber optically coupled to the first segment of polarization maintaining fiber, said second segment having orthogonal birefringent axes oriented at substantially 45 degrees to the orthogonal birefringent axes of the first segment, said second segment having a length $L_2$ equal to about:

$$\lambda^2/(2.\Delta\lambda.\Delta n_2);$$

where $\lambda$ is the laser diode wavelength, $\Delta\lambda$ is the laser longitudinal mode spacing, and $\Delta n_1$ is the birefringence of the polarization maintaining fiber of the first segment of polarization maintaining fiber, and $\Delta n_2$ is the birefringence of the polarization maintaining fiber of the second segment of polarization maintaining optical fiber.

2. A depolarized optical source comprising:

a laser source emitting a linearly polarized beam comprising multiple longitudinal modes;

a first segment $L_1$ of polarization maintaining optical fiber optically coupled to receive the beam from the laser source, said first segment having orthogonal birefringent axes, one of said orthogonal birefringent axes being oriented at substantially zero degrees relative to a plane of polarization of the emitted beam, said first segment having a length $L_1$ equal to about $$\lambda^2/(4.\Delta\lambda.\Delta n_1);$$

a second segment $L_2$ of polarization maintaining optical fiber optically coupled to the first segment of polarization maintaining fiber, said second segment having orthogonal birefringent axes oriented at substantially 45 degrees to the orthogonal birefringent axes of the first segment, said second segment having a length $L_2$ equal to about:

$$\lambda^2/(2.\Delta\lambda.\Delta n_2);$$

where $\lambda$ is the laser diode wavelength, $\Delta\lambda$ is the laser longitudinal mode spacing, and $\Delta n_1$ is the birefringence of the polarization maintaining fiber of the first segment of polarization maintaining fiber, and $\Delta n_2$ is the birefringence of the polarization maintaining fiber of the second segment of polarization maintaining optical fiber.

3. A depolarizer for converting a linearly polarized laser output having an optical spectrum comprising multiple longitudinal modes into light in which the intensity is substantially equally divided between orthogonal polarization states comprising:

a first segment $L_1$ of polarization maintaining optical fiber optically coupled to receive the linearly polarized laser output, said first segment having orthogonal birefringent axes, one of said orthogonal birefringent axes being oriented at substantially zero degrees relative to a plane of polarization of the laser output;

a second segment $L_2$ of polarization maintaining optical fiber optically coupled to the first segment of polarization maintaining fiber, said second segment having orthogonal birefringent axes oriented at substantially 45 degrees to the orthogonal birefringent axes of the first segment, where the length of L2 corresponds to a first minimum of the coherence function of the optical spectrum of the laser output, and wherein the length of segment $L_1$ is equal to 0.4–0.6 the length of $L_2$.

4. A depolarizer as defined in claim 3, wherein the length of segment $L_2$ is a function of the longitudinal mode spacing of the optical spectrum of the laser output such that half the longitudinal modes experience a substantially 90 degree polarization change relative to the other half.

5. A depolarized pump source for a Raman amplifier comprising:

a plurality of Fabry-Perot laser sources, each having an output at a different wavelength;

at least one polarization maintaining beam combiner optically coupled to the plurality of laser sources by a length of polarization maintaining optical link;

a depolarizer for receiving a combined polarized beam from the beam combiner into light in which the intensity is substantially equally divided between orthogonal polarization states, the depolarizer including:

a first segment $L_1$ of polarization maintaining optical fiber optically coupled to receive the combined polarized beam, said first segment having orthogonal birefringent axes, one of said orthogonal birefringent axes being oriented at substantially zero degrees relative to a plane of polarization of the laser output, said first segment having a length $L_1$ equal to about $\lambda_2/(4.\Delta\lambda.\Delta n_1)$ less a length equal to the length of the polarization maintaining link; and, a second segment $L_2$ of polarization maintaining optical fiber optically coupled to the first segment of polarization maintaining fiber, said second segment having orthogonal birefringent axes oriented at substantially 45 degrees to the orthogonal birefringent axes of the first segment, said second segment having a length $L_2$ equal to about:

$$\lambda^2/(2.\Delta\lambda.\Delta n_2);$$

where $\lambda$ is the laser diode wavelength, $\Delta\lambda$ is the laser longitudinal mode spacing, and $\Delta n_1$ is the birefringence of the polarization maintaining fiber of the first segment of polarization maintaining fiber, and $\Delta n_2$ is the birefringence of the polarization maintaining fiber of the second segment of polarization maintaining optical fiber.

6. A depolarized pump source for a Raman amplifier as defined in claim 5, including a plurality of stages of polarization maintaining beam combiners optically coupled by polarization maintaining links.

* * * * *